United States Patent [19]

Fu et al.

[11] 4,112,575
[45] Sep. 12, 1978

[54] FABRICATION METHODS FOR THE HIGH CAPACITY RAM CELL

[75] Inventors: Horng-sen Fu, Dallas; Thomas C. Holloway, Garland; Al F. Tasch, Jr., Richardson; Pallab K. Chatterjee, Dallas, all of Tex.

[73] Assignee: Texas Instruments Incorporated, Dallas, Tex.

[21] Appl. No.: 752,598

[22] Filed: Dec. 20, 1976

[51] Int. Cl.² .......................................... H01L 21/70
[52] U.S. Cl. ............................... 29/577 C; 357/24; 357/45; 365/178; 365/182
[58] Field of Search ........................... 29/577–578, 29/579; 340/173 R, 173 SP, 173 CA; 357/45, 24

[56] References Cited

U.S. PATENT DOCUMENTS

| | | | |
|---|---|---|---|
| 3,387,286 | 6/1968 | Dennard | 357/45 X |
| 3,720,922 | 3/1973 | Kosonocky | 357/24 |
| 3,740,732 | 6/1973 | Frandon | 357/45 X |

*Primary Examiner*—Roy Lake
*Attorney, Agent, or Firm*—James T. Comfort; Rene' E. Grossman; William E. Hiller

[57] ABSTRACT

Disclosed is a process for constructing an array of memory cells. Each cell is constructed to have a high storage capacity and low leakage current. The cells are formed on a surface of a semiconductor substrate. Each cell has a storage region and an adjacent transfer region. The process forms a deep ion layer and a shallow ion layer in the storage region of each cell. At the storage region-transfer region interface, the deep ion layer lies laterally within the shallow ion layer. In the other portions of the storage region, the deep ion layer extends laterally into adjoining channel stops.

51 Claims, 47 Drawing Figures

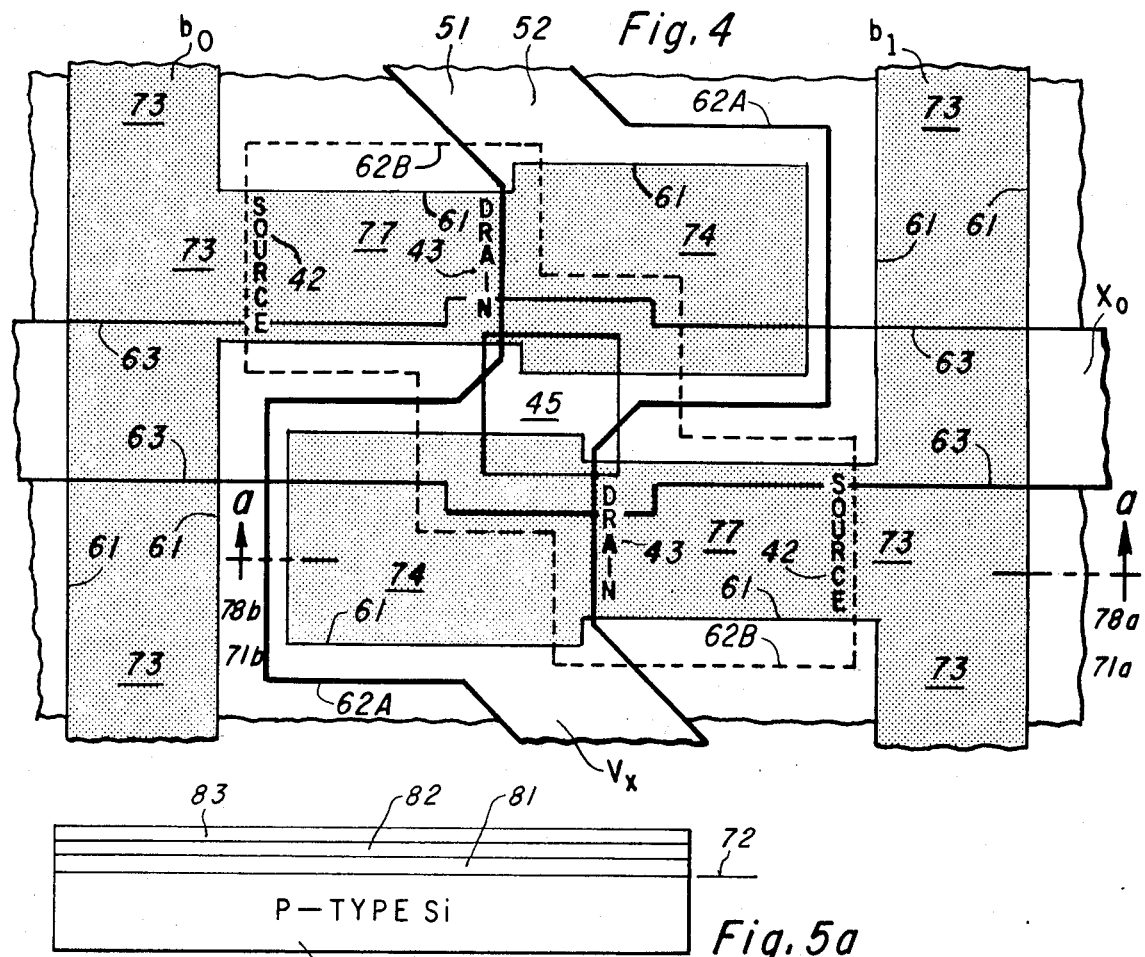
Fig. 4
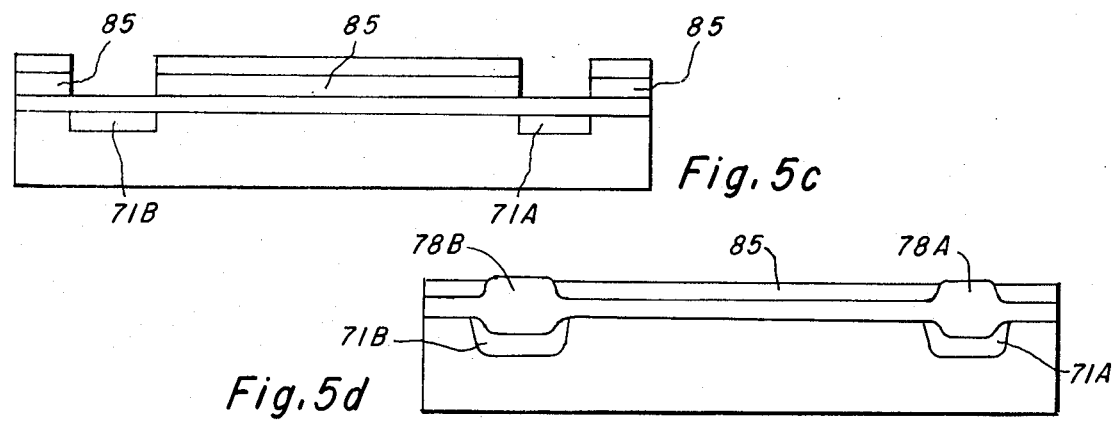
Fig. 5a
Fig. 5b
Fig. 5c
Fig. 5d

FABRICATION METHODS FOR THE HIGH CAPACITY RAM CELL

BACKGROUND OF THE INVENTION

This invention relates to semiconductor memories, and more particularly to binary random access memories (RAM) having an array of improved memory cells.

During the past several years, much time, effort, and money has gone into the development of high density, low cost memories. This is because the computer industry has continually demanded more and more storage capacity. As a result of this past memory development work, the number of bits of storage per chip has increased from 16 to 16,000. In addition, the cost per bit has been decreased by a factor of approximately 200.

A major reason for this progress has been the development of small, reliable memory cells. Thousands of these cells are formed on a single chip; and the chips are interconnected to form larger memories. The cost in the production of semiconductor chips is such that most of the expense is in bonding, packaging, testing, handling, and the like, rather than in the cost of the small chip of silicon which contains the actual circuitry. Thus, any circuit which can be contained within a chip of a given size, for example, 30,000 square mils, will cost about the same as any other. By forming large numbers of memory cells in a chip, large economies in the cost per bit can result if reasonable yields are obtained. However, as the size of a chip increases, the yield decreases; so that the advantages of larger chip sizes are outweighed by reduction in yields. Presently, chips of about 150-250 mils on a side are commonly made in the semiconductor industry. Accordingly, it is desirable to reduce the area occupied by each cell.

Three types of cells are currently used in the construction of semiconductor memory chips. These memory cell types are called the one transistor cell (1-T cell), the double level polysilicon cell (DLP cell), and the charge coupled cell (CC cell). The two former cell types are described in U.S. Pat. Nos. 3,387,286 by R. H. Dennard and 3,720,922 by W. F. Kosonocky, respectively. The CC RAM cell is described in copending application Ser. No. 354,889 filed Mar. 3, 1975 by A. Tasch, Jr., et al., abandoned in favor of continuation application Ser. No. 739,758 filed Nov. 8, 1976, now U.S. Pat. No. 4,060,738 issued Nov. 29, 1977.

As alluded to earlier, the 1-T cell, the DLP cell, and the CC cell each is the product of many years of work and refinement. Thus, it could be expected that large improvements in such a developed field are unlikely. However, the present invention includes a novel cell - termed a "high capacity" or "hi-C" cell - which has several significant advantages over the prior art.

One important limitation of the 1-T, DLP, and CC cells is that they all have less charge capacity per unit area than is desirable. A high charge capacity per unit area is desired because as the number of bits per chip increases, the size of each cell must necessarily decrease. Thus the amount of charge that can be stored in each cell decreases. And eventually, a point is reached beyond which the cell cannot be reduced further because the amount of charge that the cell can store is indistinguishable from noise. Thus, charge capacity per unit area is a fundamental limitation on the minimum cell size.

The 1-T and DLP cells are also deficient in a second parameter - which is called leakage current. The leakage current is a measure of the quantity of electron-hole pairs that are thermally generated in a cell. These charge carriers are undesirable because they alter the amount of charge that is stored as information, and eventually they totally cancel the information charge. In order to avoid this cancelling effect, the information charge in the cell must be periodically refreshed at certain minimum intervals. The refresh period is inversely proportional to the leakage current in the cell. It is an experimentally verified fact that leakage current in the 1-T and DLP cells is typically 3 to 8 times greater than that of the CC cell. But on the other hand, charge capacity of the CC cell is only approximately half the charge capacity of the 1-T or DLP cells. Thus, no single cell type has the best of both parameters.

Because of these and other limitations in the prior art, and because of the demand for more bits of storage per chip, it is therefore one object of this invention to provide a process for constructing an array of improved memory cells.

It is another object of the invention to provide a process for constructing a memory cell having an increased storage capacity per unit area.

It is still another object of the invention to provide a process for constructing a memory cell having low leakage current while at the same time having increased storage capacity per unit area.

SUMMARY OF THE INVENTION

These and other objectives are accomplished in accordance with the invention by a process for constructing an array of Hi-C memory cells selectively addressed by row and column lines. In one particular process channel stop regions and overlying field oxide regions are patterned in a first surface of a semiconductor substrate to define the cell area of each cell of the array. Then, ions of a first type are introduced throughout each of the cell areas, thereby forming a shallow ion layer. Next, ion impurities of a second type are introduced throughout each of the cell areas at a level lying below the shallow ion layer thereby forming a deep ion layer. This deep and shallow ion layer combination increases the charge capacity per unit area of each cell. Also, the perimeter of the deep ion layer lies adjacent the channel stop regions, resulting in a potential barrier around each cell, and thus reducing each cell's leakage current. Then a first insulating layer is disposed on the first surface overlying the cell areas. Next, a layer of polysilicon is patterned on the first insulating layer above a portion of each of the cell areas, thereby forming storage gate regions. Next, the portion of the insulating layer and the portion of the shallow ion layer lying between the storage gate regions and the channel stop regions are removed by etching. Then, ions of the first type are introduced through the area lying between the storage gate regions and the channel stop regions. The depth of these ions and their concentration is approximately the same as that of the deep ion layer. In addition, these ions are introduced by a high energy implant operation, and therefore they laterally straggle under the storage gate regions. The result is, that a small potential well is created in the straggle area. This is important because a potential well (as opposed to a potential barrier) will not reduce the charge capacity of the memory cell.

Other processes for constructing the array of Hi-C memory cells are disclosed. Each of these processes forms a memory cell having a storage region containing ions of a first type lying in a shallow ion layer and ions of a second type lying in a deep ion layer. In addition, the deep ion layer lies laterally within the shallow ion layer at the interface between the storage region and transfer region.

BRIEF DESCRIPTION OF THE DRAWINGS

The novel features believed characteristic of the invention are set forth in the appended claims. The invention itself however, as well as other features and advantages thereof will best be understood by reference to the following detailed description of particular embodiments, read in conjunction with the accompanying drawings wherein:

FIG. 4 is a greatly enlarged top view of one of the memory cells of FIG. 2;

FIGS. 5a–5j are cross-sectional views of one cell taken at various steps in a first construction process;

DETAILED DESCRIPTION

Figure 1:
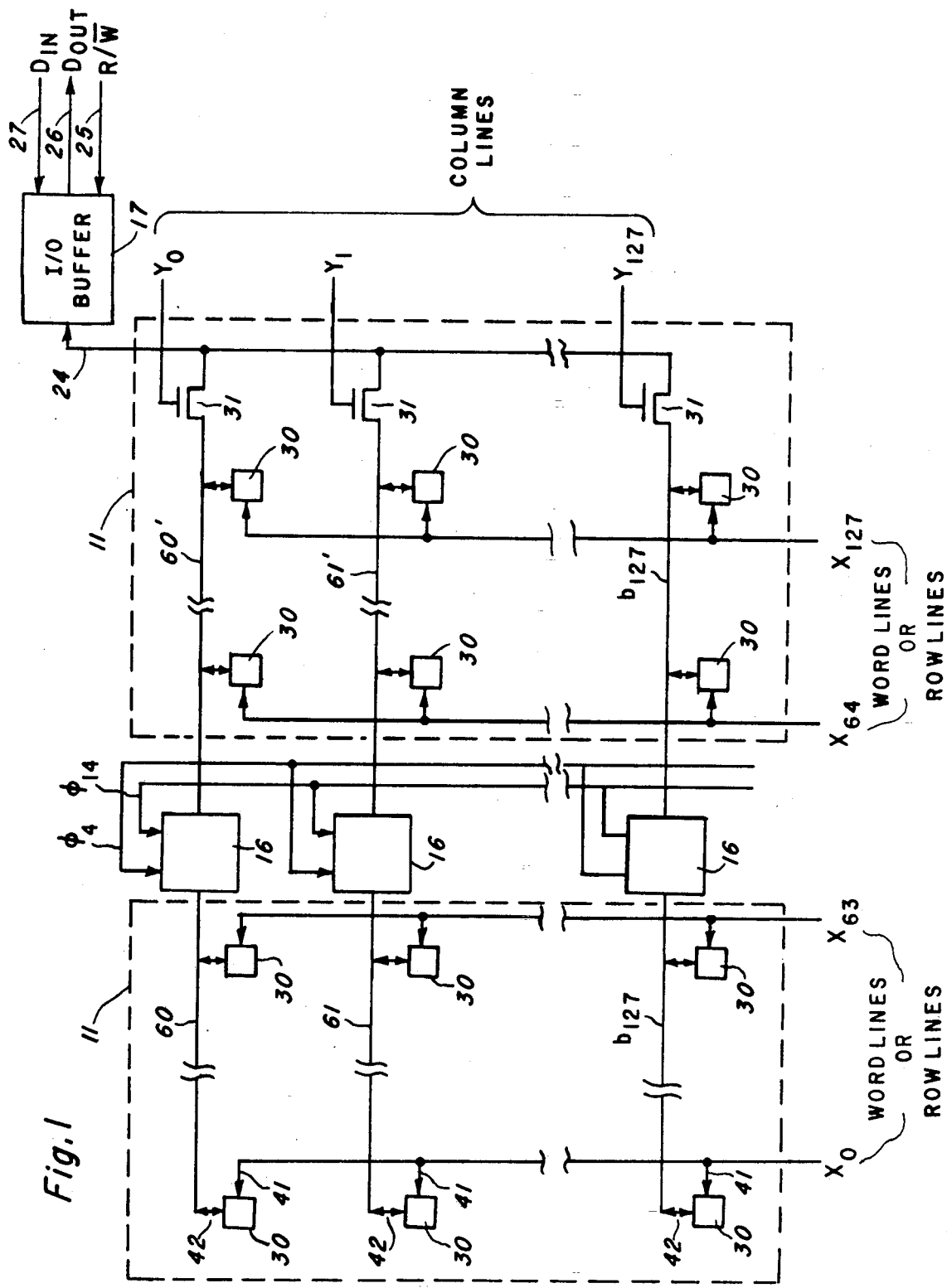
FIG. 1 is a schematic diagram of an array of Hi-C memory cells.

Referring now to FIG. 1, a schematic diagram shows an array 11 of Hi-C memory cells which may be constructed according to the claimed process. Array 11 is used in conjunction with an MOS memory chip as described in copending application Ser. No. 740,528 filed Nov. 10, 1976 by A. F. Tasch, Jr.

Each Hi-C memory cell 30 has a transfer gate 41 that is used to address the cell. The transfer gate selectively couples to one of several "row" or "word" lines X0–X127. All the cells that are coupled to a particular row line are selected when the voltage on that line is in one state; and conversely, the same cells are deselected when the voltage on the same row line is in another state. For example, one preferred embodiment of the invention utilizes N-channel memory cells; and in that embodiment, the cells coupled to a particular row line are addressed by raising the voltage on that row line to +12 volts, and the cells are deselected by lowering the same row line voltage to ground.

Each Hi-C cell 30 also has an input-output region 42. This region of the cell is coupled to one of several bit lines to b0–b127 or b0'–b127'. The voltage on bit line pairs b0–b0', b1–b1', etc. are generally the complement of each other. The bit lines selectively couple to one of the sense amplifiers 16 and then to signal line 24 through transistors 31. Each column line couples to the gate of a selected one of transistors 31; and therefore, by increasing the voltage on one particular column line (in the case of N-channel transistors for example) line 26 will be interconnected to the corresponding bit line.

During a read operation, each of the bit lines is precharged to some voltage that is intermediate to a "1" or "0" level. Then a selection voltage is applied to the addressed row line. In response, all the cells that are coupled to that row line dump the charge they have stored as information onto their corresponding bit line. The sense amplifiers sense this charge, and in response, generate a full "1" or "0" voltage level on the bit lines. A selection voltage is then applied to one of the column lines; and this gates the "1" or "0" of the corresponding bit line onto signal line 24. This sequence is reversed for a write operation. This is, I/O buffer 17 generates a voltage on signal lead 24. Then a selection voltage is applied on one column line; and this gates the "1" or "0" voltage from lead 24 to the corresponding bit line. Then a selection voltage is applied to one row line. In response, a quantum of charge representing either a "1" or "0" is stored in the selected cell.

Figure 2:
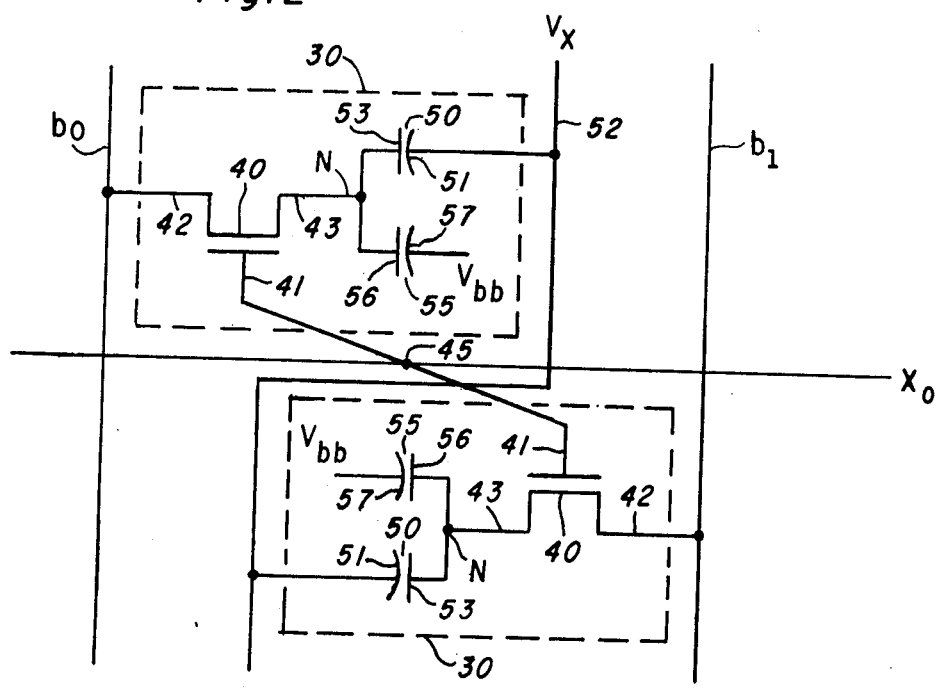
FIG. 2 is a circuit diagram of two memory cells which are contained in the array of FIG. 1.

Referring next to FIG. 2, a circuit diagram of two of the Hi-C memory cells in the array of FIG. 1 is illustrated. In this figure, the labeling on the bit lines is shown as b0, b1; and the row line is shown as X0. Note however, that the circuit diagram for the other memory cells in array 11 is identical to this figure except for the labeling.

The circuit of FIG. 2 is comprised of an insulated gate field effect transistor 40, an oxide capacitor 50, and a depletion capacitor 55. Input/output region 42 of the cell is provided by the source of transistor 40. The drain 43, of transistor 40 couples to a node N; and node N couples to a plate 53 of capacitor 50, and to a plate 56 of capacitor 55. A fixed voltage $V_x$ is applied to a second plate 51 of capacitor 50; while the second plate 57 of capacitor 55 is connected to the substrate bias voltage $V_{bb}$.

Row line X0 couples to the transfer gates 41 of transistors 40. Therefore, by selectively raising or lowering the voltage on the row line, transistors 40 turn on and turn off. When transistor 40 is on, capacitors 50 and 55 charge node N to the voltage level of the bit line; and when transistor 40 is off, the charge in capacitors 50 and 55 remains unchanged. The quantity of charge in capacitors 50 and 55 (the voltage at node N) represents the information stored in the memory cells.

To understand the significance of the Hi-C RAM cell concept it is important to emphasize that the charge in cell 30 is not only stored on oxide capacitor 50, but that it is also stored on depletion capacitor 55. In the past, depletion capacitor 55 has been neglected because for conventional substrate dopings (e.g.-10 ions/cm$^2$) of MOS RAM cells, the depletion capacitance is approximately 10 times smaller than the oxide capacitance. And in the past, nobody had successfully found a way to utilize the depletion capacitance to increase the amount of charge that could be stored in the cell.

The depletion capacitance can be increased by increasing the substrate doping in the region which forms capacitors 50 and 55. For example a P-type implant could be added to a P-type substrate. However, this increased substrate doping also causes the voltage swings which occur at node N to be reduced. And this, in turn, causes the charge capacity of the cell to actually be reduced. This fact has previously been documented.

See for example an article by A. F. Tasch, Jr. in the IEEE Journal of Solid-State Circuits for February 1976.

However, if a shallow implant (at or very the near SiO$_2$-Si interface) of conductivity type opposite to the substrate is also added, the flatband voltage in the storage region is shifted in the negative direction. This then allows the potential of node N to maintain its full orignal swing while at the same time increasing the depletion capacitance. As a result, the charge capacity of the cell may be increased by as much as 100%. This is an important aspect of the Hi-C cell.

Figure 3:
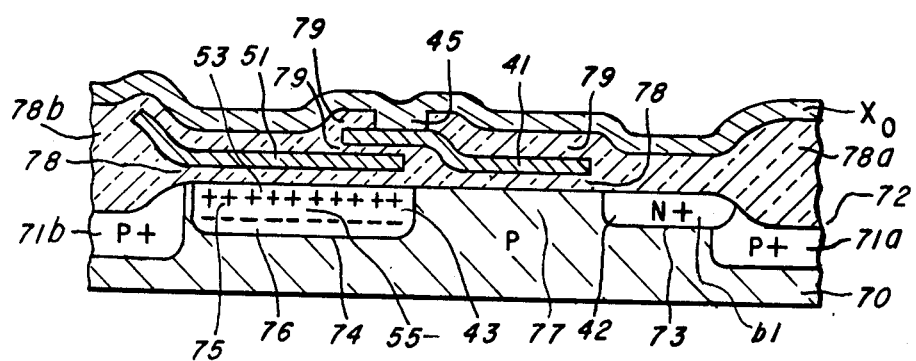
FIG. 3 is a greatly enlarged cross-sectional view of one of the memory cells of FIG. 2.

Referring next to FIGS. 3 and 4, the detailed physical structure of one preferred embodiment of the Hi-C memory cells is illustrated. In these figures, the actual size of the cell is greatly enlarged. FIG. 3 is a cross-sectional view, taken along line a—a in FIG. 4. This cross-section cuts through one Hi-C memory cell, and exposes all the components of the cell. Ions in the various doped regions are labeled in FIG. 3 for an N-channel cell. However, the structure could easily be modified to provide a P-channel cell as another embodiment. Additionally, these ions will be referred to as implants; however, other methods (e.g. diffusions) may be used to introduce the ions into the various regions.

The Hi-C memory cell array is formed by utilizing a P-type semiconductor substrate 70. This substrate has a surface 72 near which several elements of each memory cell are formed. The boundary of each cell area has a rectangular shape and is open on one end. This boundary is defined by field oxide regions 78a and 78b, and the corresponding channel stop implant regions 71a and 71b. An N+ region 73 lies near surface 72 and is adjacent to the open end of the cell boundary. Region 73 forms bit line b1 and transistor source 42. Several bit lines selectively interconnect the cells, and their boundary is also formed by field oxide regions 78a and 78b, and channel stop regions 71a and 71b.

A storage region 74 fills most of the space within the cell boundary and is spaced apart from region 73. This storage region is formed by two ion implants 75 and 76 near surface 72. Region 74 forms capacitor 55, plate 53 of capacitor 50, and drain 43. Implant 75 is of an N-type material and it lies relatively near surface 72. The other implant 76 of the pair is of a P-type material, and it lies beneath the N-type implant. In the drain 43 area the P implant either coincides with or lies within the N-type implants. This avoids potential barriers to charge flow between storage region 74 and bit line b1. Further structural details of storage implant region 74 will be given following this over-all description of FIGS. 3 and 4.

An MOS transfer region 77 is formed in surface 72 between N+ region 73 and storage region 74 as a result of the substrate being a P-type material. This transfer region is not implanted. An insulating layer 78 overlies substrate surface 72. In one embodiment, insulating layer 78 is formed of SiO$_2$ and is about 1000Å thick. Storage gate 51 overlies insulating layer 78 above storage region 74; and transfer gate 41 overlies insulating layer 78 above transfer region 77 and partially overlies storage gate 51. Gates 41 and 51 are comprised of a conductive material, such as a polysilicon or a metal for example; and they are about 3000Å–8000Å thick.

FIG. 4 is a top view of two Hi-C memory cells that are arranged in accordance with the circuit diagram of FIG. 2, and the cross-sectional view of FIG. 3. The various regions illustrated in FIG. 4 lie on one of three levels as previously described. Components lying on the lowest layer are enclosed by lines 61. These components include the bit lines, b0 and b1, the transistor sources 42, the transistor drains 43, the transfer area 77 between the source and drain regions, and the storage region 74 with the double level implants. The perimeter of these elements is defined by field oxide regions 78a and 78b; and channel stops 71a and 71b.

The components lying on the second level are enclosed by lines 62a and 62b. A thin insulating layer 78; of SiO$_2$ for example, separates the first and second levels. The area enclosed by lines 62a forms storage gate 51 and storage line 52. Thus, in this configuration, storage gate 51 and storage line 52 are physically integrated into one area. This area is then connected to a fixed voltage source $V_x$. Similarly, the area enclosed by line 62b forms the transfer gates 41 of transistors 40.

Row line $X_0$ lies on the third level; and it occupies the area enclosed by line 63. The second oxide layer 79 (6000–7000Å) separates the second and third levels. Electrical connection is made between row line $X_0$ and gates 41 by a contact 45. This contact penetrates the oxide separating the second and third layers.

Of particular importance in this invention are the structural details of storage region 74. There, the P-type implant (boron for example) is made to a depth of about 2000Å–10,000Å from surface 72; and the N-type implant (arsenic for example) is made to a depth of about 100–500Å. Note that these implants actually have a Gaussian distribution in surface 72 and therefore these numbers define the depth at which the distribution peaks occur.

Boron typically is used as the deeper implant, and the implant operation is performed by an ion-implant machine. This implant may be made into the bare silicon surface 72 before insulating layer 78 is grown. Or alternatively, it can be made directly through insulating layer 78 after the layer is formed. In this latter case, the ion-implant is made at approximately 130 Kev. The dose in the silicon typically ranges from $1-8 \times 10^{12}$ ions/cm$^2$.

The shallow implant typically is arsenic or antimony. Other elements are also acceptable, but arsenic or antimony are typically used because they have a heavy mass and diffuse slowly. Therefore, they remain at or very near surface 72 during subsequent fabrication steps which are required to form the cell and any associated on-chip circuitry.

Arsenic or antimony can be implanted directly into the bare surface 72 before insulating layer 78 is formed. This process uses an implant energy of approximately 10 Kev. to 50 Kev. Alternatively, these implants can be made through insulating layer 78 after it is formed. One way to do this is to use a very high implant energy. As an example, approximately 300 Kev. may be required. The high energy is required due to the heavy mass of the ions.

Alternatively, a conveniently lower implant energy can be used which will place most of the dopants within insulating layer 78. The concentration of these dopants is chosen so that the desired amount will subsequently diffuse from insulating layer 78 into surface region 72 during the remaining steps of fabrication. As an example of this approach, arsenic may be implanted into 1000Å of gate oxide at 105 Kev. The concentration is typically $1-8 \times 10^{13}$ ions/cm$^2$. The amount of arsenic which subsequently diffuses into surface 72 ranges from $1-6 \times 10^{12}$ ions/cm$^2$.

Referring now to FIGS. 5a–5j a method for constructing the array 11 of the above described Hi-C memory cells is illustrated. These figures illustrate cross-sectional views of one cell taken at various steps in the construction process. This one cell pattern is the basic pattern of the entire array. Therefore, the pattern need only be repeated to construct the entire array.

Referring now to FIGS. 5a–5e, the initial steps of the construction process are illustrated. The purpose of these initial steps is to form the perimeter of the cells (i.e., to define the cell area) and the perimeter of the interconnecting bit lines. As a first step, a silicon dioxide layer 81 is formed on surface 72 of substrate 70. Layer 81 is approximately 1000Å thick. It is formed by exposing the silicon substrate to an oxidizing atmosphere at approximately 1000° C. Next a silicon nitride layer 82 is formed on top of layer 81. Layer 82 is approximately 1000A thick; and it is formed by exposing the substrate 70 to an atmosphere containing silane and ammonia. Then a layer 83 of photoresist is deposited on top of the silicon nitride layer 82. The photoresist may be of a type called Kodak Metal Etch resist as an example.

The next several steps form the field oxide regions 78a and 78b, and the corresponding channel stops 71a and 71b. To this end, the photoresist is exposed to ultraviolet light through a mask having a pattern of the desired field oxide-channel stop pattern. The photoresist is then developed leaving photoresist regions 84 as illustrated in FIG. 5b.

The slice is next subjected to a selective etchant (wet chemical, plasma, or ion mill) which will remove the silicon nitride in the areas where the photoresist has been removed. Thus, only areas 85 of the silicon nitride remain after this etching step. The result is illustrated in FIG. 5c. Next, a P-type implant is made through the exposed oxide layer to form channel stop regions 71a and 71b. This implant step may be performed with boron ions at approximately 100 Kev. The dosage of these atoms is typically $(0.1-1.0) \times 10^{13}$ ions/cm$^2$.

Next, photoresist layer 83 is removed by an appropriate clean-up step and then field oxide regions 78a and 78b are grown. The latter is performed by exposing the slice to an oxidation operation. The oxidation operation involves exposing the slice to steam at approximately 900°–1000° C for several hours. During this operation, the nitride layer 85 masks the oxidation where it exists. The oxide that is formed during this process is approximately 3000Å–10,000Å thick. And it penetrates the surface of the silicon to a depth of approximately 1500–2500Å. However, the original P+ regions 71a and 71b are only partially consumed, and the remainder diffuse ahead of the oxidation front. The result of this operation is illustrated in FIG. 5d.

Figure 5E:
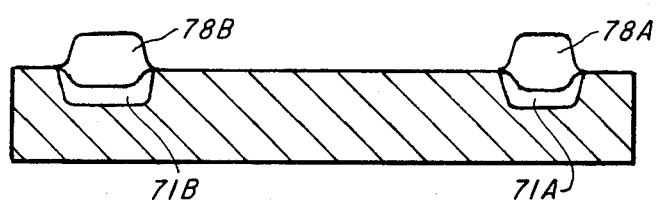
Figure 5F:
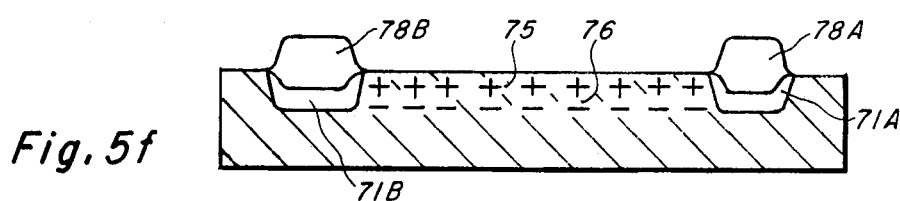

Then the nitride layer 85 is removed by an etchant, such as phosphoric acid. And next, oxide layer 81 is removed by another etchant, such as hydrogen flouride. This completes the formation of the cells' perimeter. The result is illustrated in FIG. 5e.

Next, the initial steps in forming storage region 74 are performed. To this end the entire area enclosed by field oxide 78a and field oxide 78b is implanted twice. The two implants consist of a shallow ion implant 75 and a deep ion implant 76. These implants have majority carriers that are opposite in type to each other. The implantation is made with an ion implant machine. The Gaussian distribution peak of the deep implant occurs within 1500–10,000Å from surface 72. And the concentration level of the implanted deep ions is within $1-40 \times 10^{12}$ ions/cm$^2$. During implantation, portions of the deep ions straggle laterally from each cell area to the adjacent channel stop regions. This results in a potential barrier around each cell. And this potential barrier prevents leakage charge that is generated in the field oxide regions from being collected in the cells' storage regions. Thus leakage current of the cell is reduced. As an example of an acceptable P-type ion, boron may be used. Shallow ion implant 75 has a Gaussian distribution peak which occurs within 500Å from surface 72. The concentration level of these ions is within $1-9 \times 10^{12}$ ions/cm$^2$. As an example of an acceptable N-type ion, arsenic or antimony may be used. These ions have a heavy mass, and as a result they are preferred because they do not diffuse rapidly in silicon at elevated temperatures, and do not penetrate deeply into silicon when implanted.

Figure 5G:
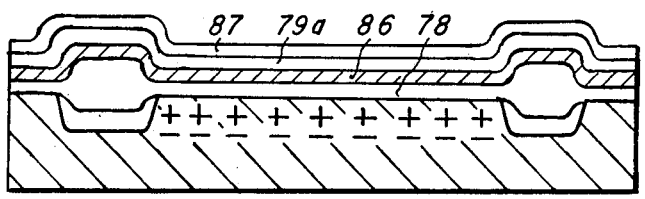

The next several steps form storage gate 51. First, gate oxide layer 78 is thermally grown over the entire surface of the slice. This oxide layer is approximately 500–1000Å thick. (Note that the above described shallow implant step may be performed through this oxide layer after it is formed, by using a higher implant energy.) Next a polysilicon layer 86 is formed on top of oxide layer 78. Polysilicon layer 86 also covers the entire surface of the slice. It is approximately 3000–5000A thick. Polysilicon layer 86 is then heavily doped by an N+ ion implant or diffusion in order to make it a highly conductive electrode. Next, a layer of oxide 79a may be thermally grown or deposited over polysilicon layer 86. This is an optional step; and it is performed only if oxide layer 79 is desired to be relatively thick between storage gate electrode 51 and transfer gate electrode 41. Then, a photoresist layer 87 is deposited on top of polysilicon layer 86 (or oxide layer 79a if it is put down). This photoresist also covers the entire surface of the slice. The result of these steps is illustrated in FIG. 5g.

Figure 5H:
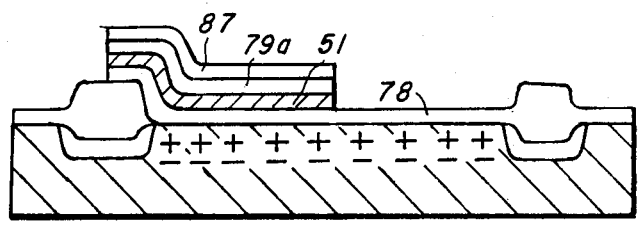

The photoresist is then masked according to storage gate 51. Then, the masked slice is exposed to ultraviolet light, and the photoresist is developed. Polysilicon layer 86 is then selectively etched, with the result that storage gate 51 is formed, as shown in FIG. 5h.

Figure 5I:
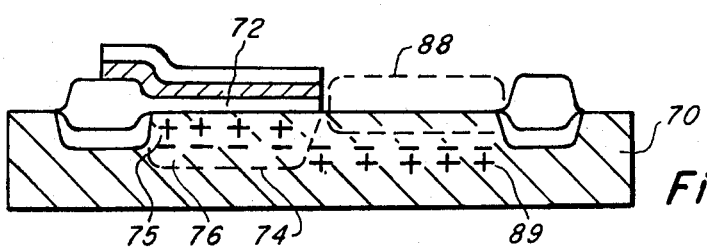

The next several steps form transfer region 77. First, with photoresist 87 remaining over storage gate 51, an etch is made in region 88. Region 88 fills the space between field oxide 78a and storage gate 51 as illustrated in FIG. 5i. This etch removes the oxide and also removes approximately 100Å–10,000Å of the silicon in region 88. By etching the silicon, the shallow implant 75 lying in region 88 is removed. The oxide etch is made with a substance which will not attack the polysilicon of the storage gate 51 and thus the etch is self-aligned to storage gate 51 and field oxide 78a.

Next ions 89 are deeply implanted into region 88. These ions 89 have majority carriers of a type opposite to those of the previously described ions 76. Thus, ions 89 and ions 79 cancel each other within regions 88. And the net result is the same as if little or no ion implant had been made. In addition, due to the high energy required to perform this implant, the ions 89 straggle laterally into the region lying slightly under storage gate 51. The result is that a small potential well is created at the interface of storage region 74 and transfer region 77 due to a slight excess of N-type ions in the straggle region. This is important because a potential well, as opposed to a potential barrier, will not reduce the charge capacity of storage region 74. The result of these steps is illustrated in FIG. 5i.

Figure 5J:
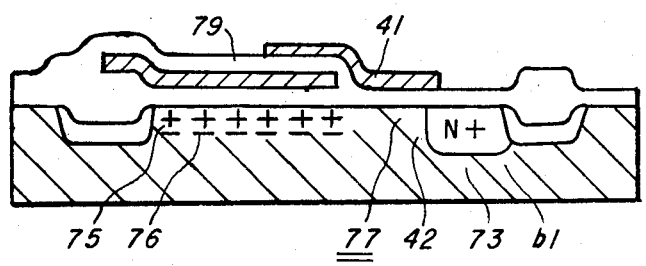

Next transfer gate 41 and region 73 are formed as follows. First, oxide layer 79 is formed over the entire surface of the slice. Layer 79 is thermally grown and may be approximately 300–1000Å thick over region 88. It will, of course, be thicker over storage gate 51 if oxide layer 79a was formed. Next a polysilicon layer, which will be patterned to form transfer gate 41, is deposited over the entire surface on top of oxide layer 79. The polysilicon is then covered with photoresist. The photoresist is then etched to form transfer gate 41. Then, the oxide layer 79 lying above region 73 is selectively etched. Region 73 is then implanted or diffused using an N-type ion to form bit line b1 and transistor source 42. This step also dopes the polysilicon comprising transfer gate 41, thereby making the transfer gate a highly conductive electrode. The result of these steps is shown in FIG. 5j.

Next an oxide layer is grown or deposited approximately 6000–7000Å thick over the entire surface. This is performed at low temperatures to avoid the diffusion of the previously implanted regions. The oxide is then masked and etched to form an area for word line contact 45. Next, a conductor such as aluminum is deposited over the entire oxide surface. The aluminum is then covered with photoresist which is patterned and etched to form the word lines. This essentially completes the manufacturing process. However, it is understood that the slice will also be coated with a protective layer, scribed, broken into individual chips, and mounted into packages according to conventional procedures in the industry.

A second method for constructing the array of Hi-C memory cells is a variation of the above described first method, and it define of the following steps. To begin, the boundary of each cell and line bit lines are formed by the same steps as described in conjunction with FIGS. 5a–5e. Then, the deep implant 76 is made as described in conjunction with FIG. 5f. However, the shallow implant step as therein described is not performed. Instead, the gate oxide layer 78 is grown after the deep implant steps are performed. Next, the ions 75 are implanted into oxide layers 78. The concentration of these ions ranges from 1–8 × $10^{13}$ions/cm². This is approximately 10 times larger than the concentration of the previously described shallow implant that was made into substrate 70. All of the other steps that were described in conjunction with FIGS. 5g–5h to form storage electrode 51 are then performed. This results in cells having a cross-section as illustrated in FIG. 5h, except that the shallow implant ions 75 are entirely contained in oxide layer 78. In order to confine ions 75 entirely to oxide layer 78, the deposit of polysilicon layer 86 and oxide layer 79a is performed at low temperatures (<720°).

Next oxide layer 78 is etched out of region 88. This, of course, also removes the shallow implant that was contained within oxide layer 78 of region 88. Then a high temperature step is performed which causes a portion of the shallow implant that is contained in the remaining oxide layer 78 to diffuse into the surface 72 of the underlying silicon 70. This forms storage region 74. Next, a deep implant of ions 89 is made as previously described in conjunction with FIG. 5i. And then, all of the steps as described in conjunction with FIG. 5j are performed, thereby completing the construction of the Hi-C cell.

A third method of forming an array of Hi-C memory cells is illustrated in FIGS. 6a–6j. Here again, the figures are cross-sectional views taken through one cell of the array at various stages in the process. The one cell cross-sections illustrate the basic pattern which is repeated for each cell in the array.

Figure 6A:
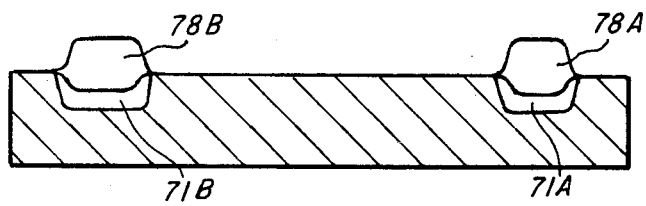
FIGS. 6a–6j are cross-sectional views taken through one cell at various steps in another construction process.

The first steps of this process form field oxide regions 78a and 78b and the corresponding channel stop regions 71a and 71b. These regions border the cell area of each cell and the interconnecting bit lines. The process used to form these regions is the same as the process previously described in conjunction with FIGS. 5a–5e. The result of these steps is shown in FIG. 6a.

Figure 6B:
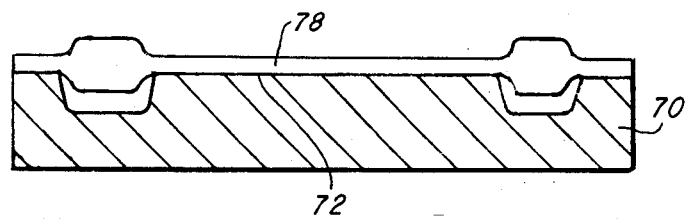
Figure 6C:
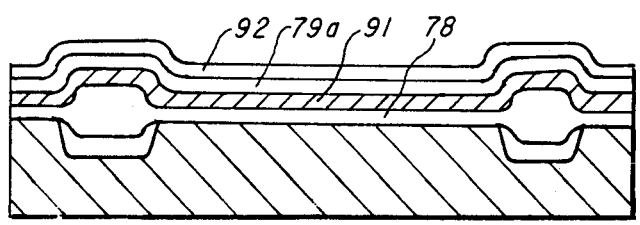
Figure 6D:
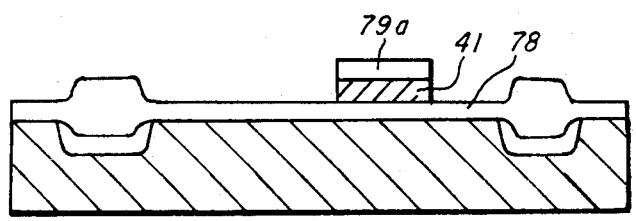

Next, transfer gate 51 is formed as follows. First, an oxide layer 78 is grown on the surface 72 of substrate 70 as illustrated in FIG. 6b. This oxide layer covers the entire surface of the substrate and is approximately 300–1000Å thick. Then a polysilicon layer 91 is formed on the oxide layer 78 and heavily doped N+ by implantation or diffusion. The polysilicon is approximately 2000–5000Å thick. Then, an insulating oxide layer 79a is optionally grown or deposited as described in conjunction with FIG. 5g. Then, photoresist 92 is deposited on top of the polysilicon layer 91 (or oxide layer 79a if it is put down) as illustrated in FIG. 6c. The photoresist 92 is then exposed to ultraviolet light through a mask having the form of transfer gate 41. The polysilicon layer 91 is then selectively etched according to the mask thereby forming a transfer gate 41. The result is illustrated in FIG. 6d.

Figure 6E:
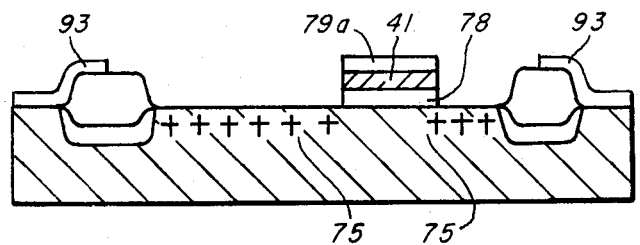

Then storage region 74 is formed by the following steps. A photoresist layer 93 is deposited on the surface in a pattern which exposes only the area between field oxide regions 78a and 78b. Then a shallow implant of N-type ions 75 is made into the exposed area. As in the previous process, the N-type ions may be arsenic or antimony. Their concentration is approximately 1–9 × $10^{12}$ions/cm². And the depth of the Gaussian distribution peak is within 500Å from the surface. This implant self-aligns to transfer gate 41 because polysilicon transfer gate 41 masks the ions 75 from transfer region 77. The result of these steps is illustrated in FIG. 6e.

Figure 6F:
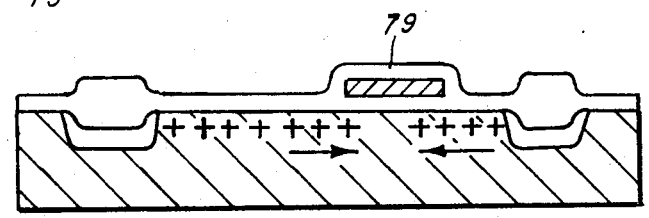

Next oxide layer 79 is grown. This is relatively high temperature operation and takes place at approximately 850°–1100° C. The thickness of the oxide is approximately 300–1000Å. The higher temperature causes shallow implant 75 to diffuse laterally slightly. Thus, implant 75 extends slightly under the transfer gate 41 as illustrated in FIG. 6f.

Figure 6G:
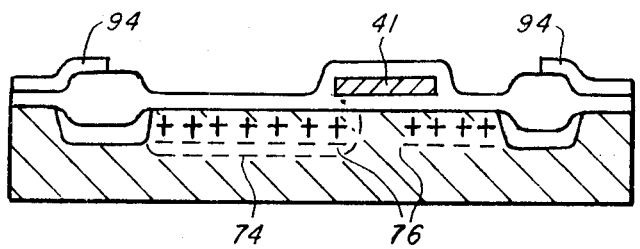

Photoresist 94 is again deposited so as to expose the area between field oxide regions 78a and 78b. And then, a deep implant of ions 76 is performed. Again, transfer gate 41 acts as a self-aligning mask for the deep implant. Boron ions may be used as the deep implant ion. The Gaussian distribution peak of the ions 76 is between 2000–10,000Å. And their concentration is approximately 1–40 × $10^{12}$ions/cm². FIG. 6g illustrates the result of this operation.

After this deep implant step is performed, the chances are good that the deep implant ions lie inside of the shallow implant ions in the lateral direction under electrode 41. That is, the deep implant ions do not penetrate under the electrode 41 as far as the shallow implant ions do. This is important, because it means that a potential barrier does not exist under transfer electrode 41. If the deep implant ions extended beyond the shallow implant ions, a potential barrier would exist which would substantially reduce the charge capacity of the Hi-C cell.

Conversely, the above process causes a potential well to exist. And this well does not degrade the charge capacity of the Hi-C cell, because the potential well is always filled with charge carriers.

Figure 6H:
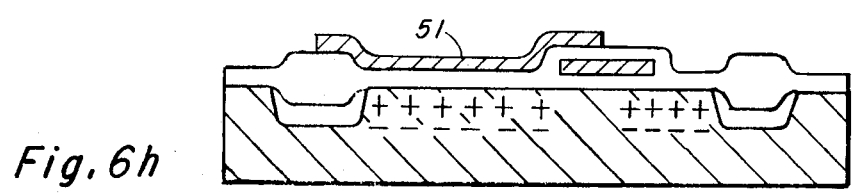

Next storage gate 51 is formed. Storage gate 51 is comprised of a polysilicon layer which is etched using photoresist and a selective etchant as previously described in conjunction with the formation of transfer gate 41. The result of these steps is shown in FIG. 6h.

Figure 6I:
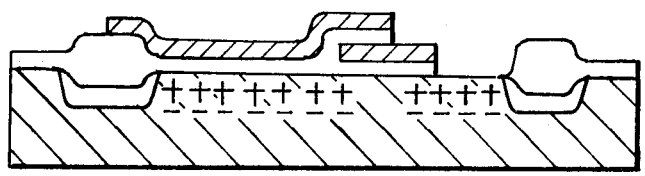
Figure 6J:
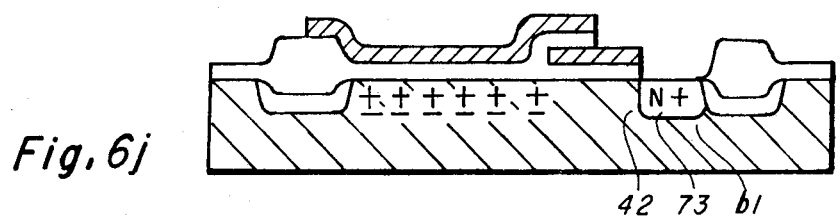

The remaining steps form bit line b1 and transistor source 42. This is performed by first etching the oxide layer 79 which lies between storage gate 51 and field oxide region 78a. FIG. 6i illustrates the result of this step. Next, an N+ implant or diffusion is made into the etched region. The concentration level of this N-type dopant is made sufficiently high to completely cancel the previous implants that were made into that area. This also heavily dopes polysilicon gate 51 and makes it conductive. FIG. 6j shows the result of this operation. This essentially completes the manufacturing process. Additional steps required to form an insulating layer and word line, to coat the structure with a protective covering, and to mount the circuit into packages are made in accordance with conventional industry practices.

A fourth method for constructing the array of Hi-C cells is a modification of the above described third method. In this fourth method, all the steps as described in conjunction with FIGS. 6a–6d are performed. Then, a shallow ion implant is made into oxide layer 78. The concentration of these ions range within $(1-8) \times 10^{13}$ ions/cm$^2$. Then, the slice is exposed to a high temperature atmosphere which causes a portion of the above implanted ions to diffuse from oxide layer 78 into the underlying substrate. The resulting concentration of ions near the surface of the substrate ranges from $(1-6) \times 10^{12}$ ions/cm$^2$. The high temperature atmosphere also causes the ions to diffuse laterally as previously described in conjunction with FIG. 6f. Then, to complete the construction of the Hi-C cell array, all of the steps as described in conjunction with FIGS. 6g–6j are performed.

In the previous four methods, deep implant 76 and shallow implant 75 were initially made throughout the entire memory cell area. Subsequently these implants were shaped to form storage area 74. By comparison, in the next two methods, methods 5 and 6, the deep implant is initially made only in storage region 74.

Figure 7A:
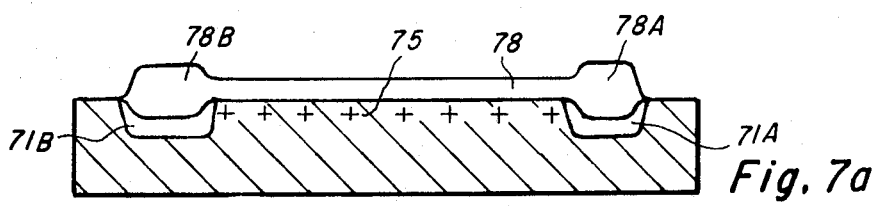
FIGS. 7a–7e are cross-sectional views of one cell taken at various steps in still another construction process.

Method 5 will now be described in conjunction with FIGS. 7a–7e. The initial steps of this method form the boundaries of the cell. That is, field oxide regions 78a and 78b, in addition to channel stop regions 71a and 71b, are formed. To form these regions, the steps as previously described in conjunction with FIGS. 5a–5e are repeated. The result is shown in FIG. 7a.

Next, the shallow implant ions 75 are implanted throughout the cell area. The depth and concentration dosage of this implant is the same as previously described. Then, the oxide layer 78 is formed on top of the entire slice. FIG. 7a also shows the result of these steps.

Figure 7B:
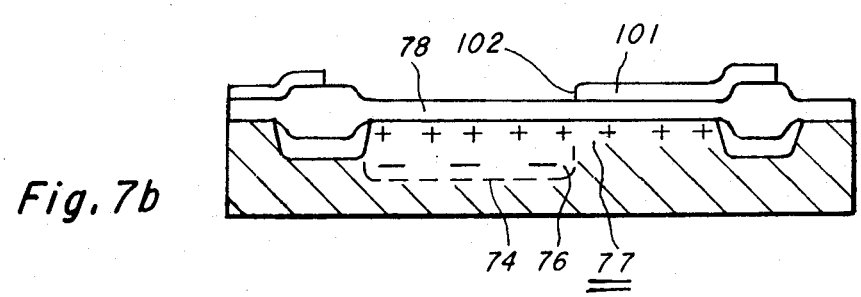

Then a photoresist layer 101 is deposited on top of oxide layer 78. Photoresist layer 101 is then patterned so as to expose storage area 74. This patterning is performed by steps as previously described. The photoresist 101 is shaped so as to extend slightly over storage region 74 in the area adjacent to transfer region 77. In other words, edge 102 of photoresist 101 lies slightly within storage region 74. Next, the deep implant of ions 76, into storage region 74, is made. The result of these steps is shown in FIG. 7b.

Figure 7C:
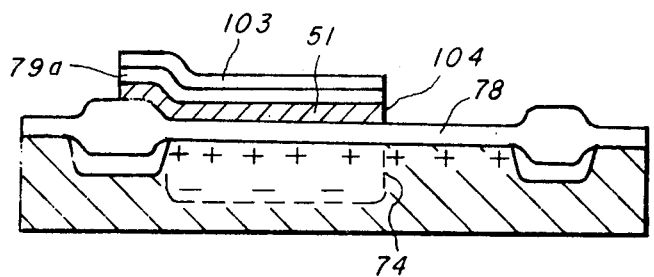

The next steps form storage gate 51. First a layer of polysilicon is deposited on top of the entire slice. Then it is doped N+ to make it conductive. Next, a layer of oxide 79a is optionally formed on top of the photoresist layer. Then a layer of photoresist is deposited on top of this oxide (or polysilicon if the optional step is eliminated). The photoresist is then masked and selectively patterned leaving layer 103 above storage region 74. The polysilicon (and oxide) is then etched, leaving storage gate 51 (and insulating layer 79a) as illustrated in FIG. 7c. Edge 104 of the polysilicon is patterned such that all of the deep implant ion 76 lies completely under storage gate 51. This is illustrated in FIG. 7c.

Figure 7D:
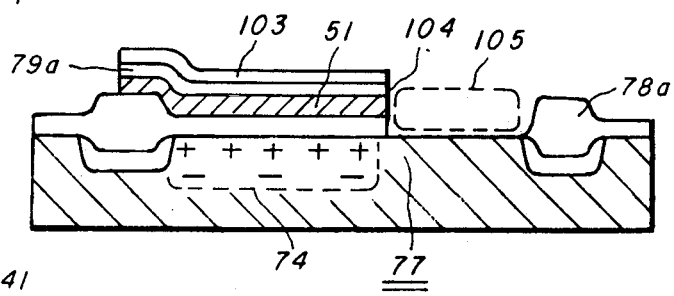

The next steps form transfer region 77. To accomplish this, an etch is made in region 105 before removing resist layer 103. Region 105 fills the space between edge 104 and field oxide region 78a. The above described position of edge 104 ensures that deep implant 76 will lie within shallow implant 75 after this etch is made. Thus no potential barriers will exist in transfer region 77. The etching in region 105 removes oxide layer 78, and in addition, removing the shallow implant ions 75 in that region. Ths result of these steps is illustrated in FIG. 7d.

Figure 7E:
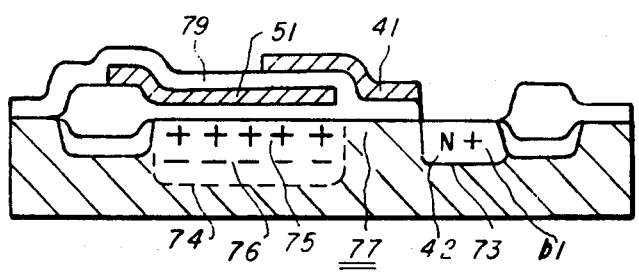

The remaining steps form bit line region 73 and transfer gate 41. The steps used to form these structures are identical to those described in conjunction with FIG. 5j. The result of these steps is illustrated in FIG. 7e.

The next, method 6, is a variation of method 5. That is, in method 6, the deep implant ion 76 is only made in storage region 74, and the shallow implant 75 is made throughout the cell area. However, the manner in which shallow implant 75 is made is different. FIGS. 8a–8e illustrate method 6.

Figure 8A:
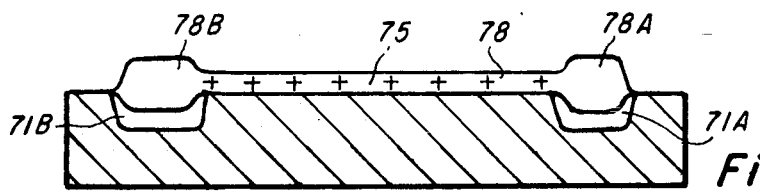
FIGS. 8a–8e are cross-sectional views of one cell taken at various stages of a process which is a modification of the process illustrated in FIGS. 7a–7e.

Referring to FIG. 8a, the initial steps of this process are illustrated. Field oxide regions 78a and 78b and channel stop regions 71a and 71b are formed as previously described. Then, an insulating layer 78 is formed on the surface of the substrate. Next, the shallow implant ions 75 are deposited entirely within oxide layer 78. The concentration of this ion implant ranges from $1-8 \times 10^{13}$ ions/cm$^2$. This is approximately a factor ten times larger than the concentration of the ions 75 that was made in conjunction with FIG. 7a. The result of these steps is illustrated in FIG. 8a.

Figure 8B:
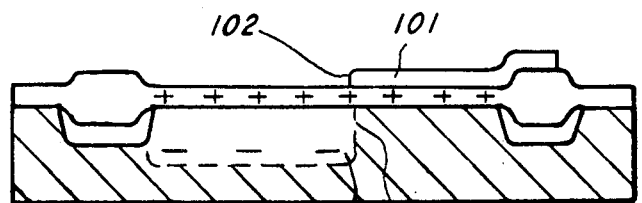
Figure 8C:
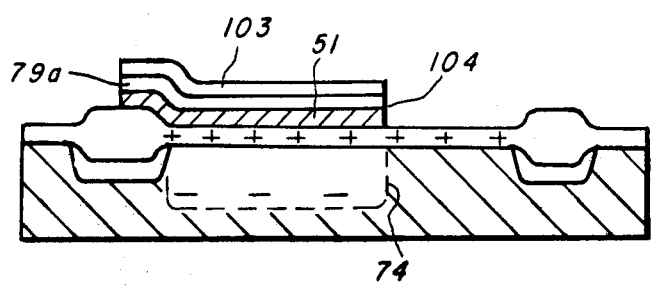

The next steps form deep ion implant 76 in storage region 74, and also form storage gate 51. These steps are similar to those previously described in conjunction with FIGS. 7b and 7c. The only difference is that here the polysilicon deposition and overlying oxide formation of layer 79a are performed at temperatures below 720° C to ensure that ion implant 75 remains entirely in oxide layer 78. The result of these steps is illustrated in FIGS. 8b and 8c.

Figure 8D:
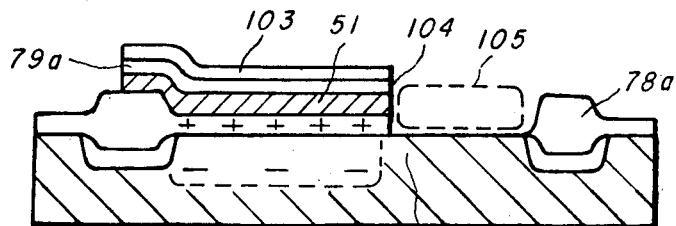

Next, transfer region 77 is formed. To accomplish this, an etch is made in region 105 before resist layer 103 is removed. Region 105 fills the space between etch 104 and field oxide 78a. This etch removes oxide layer 78 in region 105. However, the etch does not remove any significant portion of the silicon in area 105. A silicon etch, of course, is not necessary because all of the shallow implant ions 75 lie within the oxide layer 78. FIG. 8d illustrates the result of these steps.

Figure 8E:
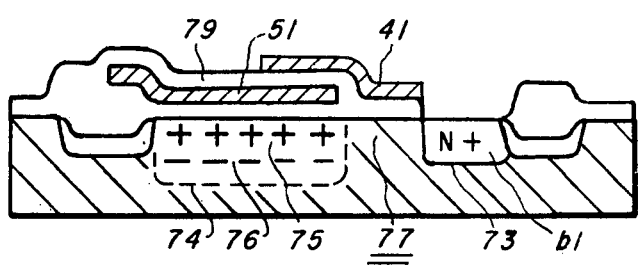

Then the slice is exposed to a high temperature atmosphere. As a result, a portion of the shallow implant ions 75 lying within oxide layer 78 diffuse into the underlying substrate. Thus, storage region 74 having a shallow implant 75 and a deep implant 76 is formed. FIG. 8e illustrates the result of this step. Also illustrated in FIG. 8e are bit line 73 and transfer gate 41. The formation of these elements and the associated word line are made by steps as previously described.

Referring now to FIGS. 9 and 10, two more methods (methods 7 and 8) for constructing the Hi-C cell are illustrated. These methods differ from the previously described methods in that shallow implant 75 and deep implant 76 are made only in storage region 74. That is, neither of these implants is made in the entire cell area as defined by field oxide region 78a and 78b.

Figure 9A:
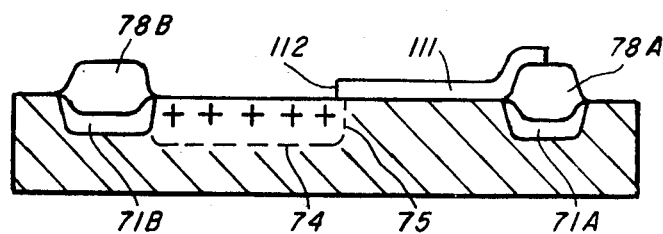
FIGS. 9a–9e are cross-sectional views taken through one cell at various stages in still another construction process.

The first of these processes is illustrated in FIGS. 9a–9e. To begin the cell boundaries as defined by field oxide regions 78a and 78b and corresponding channel stop regions 71a and 71b are formed by steps as previously described. Then a layer of photoresist is deposited on top of the entire slice. The photoresist is then selectively patterned leaving region 111 and exposing the top of storage region 74. A shallow ion implant 75 is then made into the exposed area. The dosage and implant depth is as previously described. FIG. 9a illustrates the result of these steps.

Figure 9B:
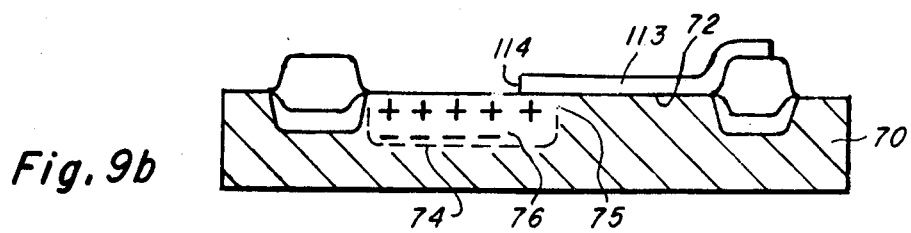

Next, a photoresist layer 113 is formed on surface 72 of substrate 70 so as to expose a window through which the deep implant of ions 76 is made. The shape of resist layer 113 is the same as that for resist layer 111, except that the edge 114 extends slightly over storage region 74. In comparison, edge 112 of the previous photoresist mask defined the edge of storage region 74. Resist layer 113 may be formed by removing resist layer 111 and subsequently forming an entirely new resist layer. Alternatively resist layer 113 may be formed from resist layer 111 by heating the latter thereby causing it to soften and move slightly in the lateral direction. In either case the deep ion implant 76 is then made. The above described relative positions of edges 112 and 114 ensure that no potential barriers will exist in transfer region 77. This is because deep implant 76 lies within shallow implant 75 at the transfer region-storage region interface. The depth and concentration level of implant 76 is as previously described. As a result of these steps storage region 74 is formed as illustrated in FIG. 9b.

Figure 9C:
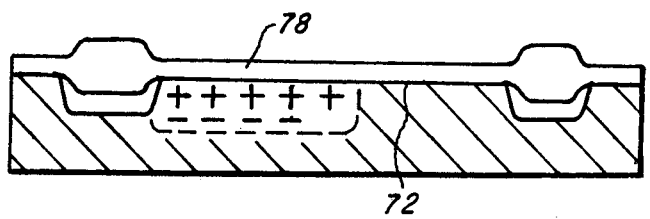
Figure 9D:
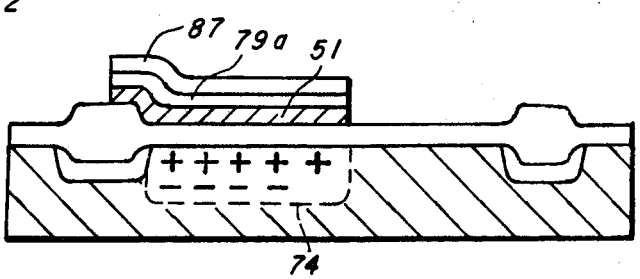
Figure 9E:
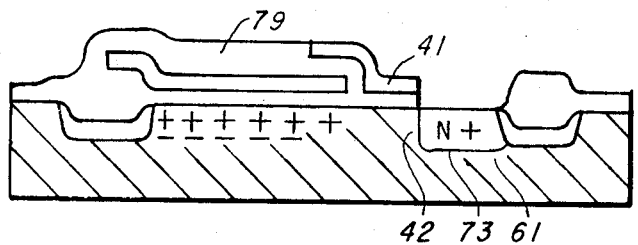

Next oxide layer 78 is formed over surface 72 of the entire slice. This is illustrated in FIG. 9c. Then storage gate 51 is formed over storage region 74 as illustrated in FIG. 9d. The steps involved in forming storage gate 51 are the same as those previously described in conjunction with FIGS. 5g and 5h. FIG. 9d illustrates the result of these steps. The remaining steps form bit line b1, transistor source 42, transfer gate 41 and the corresponding word line. All of these elements are formed by steps as previously described in conjunction with the FIG. 5j. The result of these steps is illustrated in FIG. 9e.

Figure 10A:
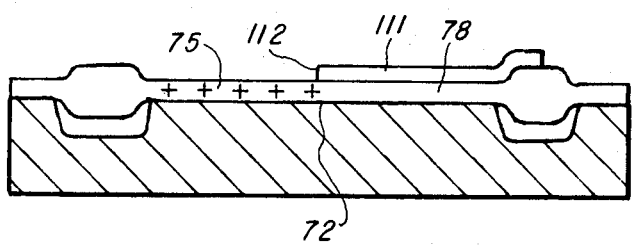
FIGS. 10a–10c are cross-sectional views taken through one cell of a process which is a modification of that illustrated in FIGS. 9a–9e.
Figure 10B:
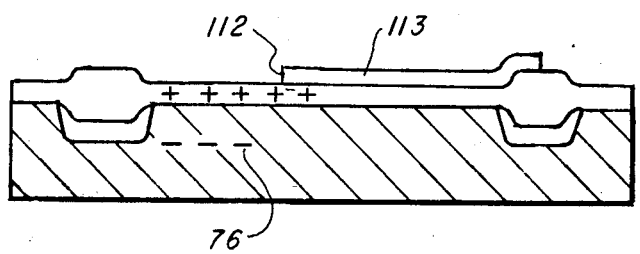
Figure 10C:
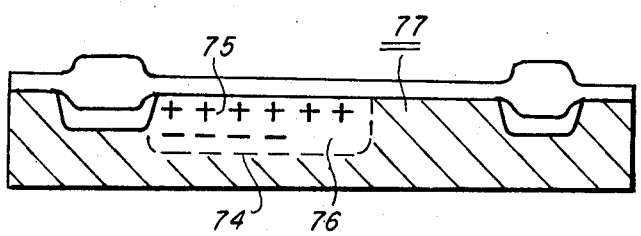

The next method, method 8 is a modification of the previously described method 7. Portions of this method are illustrated in FIGS. 10a–10c.

As before, the first steps form field oxide regions 78a and 78b and the corresponding channel stop regions 71a and 71b. However, the next step is to form oxide layer 78 over surface 72. Then, a layer of photoresist 111 is formed on top of oxide layer 78. The pattern of this photoresist layer is the same as previously described in conjunction with FIG. 9a. Then, a shallow implant of ions 75 is made into oxide 78 which is exposed by photoresist layer 111. The concentration dosage of this implant is approximately 10 times larger than the concentration dosage of the shallow implant when made directly into substrate 70. FIG. 10a illustrates the result of these steps.

Next, the photoresist layer 113 is formed as previously described in conjunction with FIG. 9b. And then the deep implant of ions 76 is performed as previously described. FIG. 10b illustrates the result of these steps.

The slice is then exposed to high temperature atmosphere. This causes a portion of the shallow implant lying in oxide layer 78 to diffuse out into the surface of the underlying substrate 70. As a result, storage region 74 is formed. And near transfer region 77, the deep implant ions lie entirely within storage region 74. This ensures that no potential barriers will exist in transfer region 77. The remaining steps which complete the cell structure are the same as those previously described in conjunction with FIGS. 9d–9e.

Figure 11A:
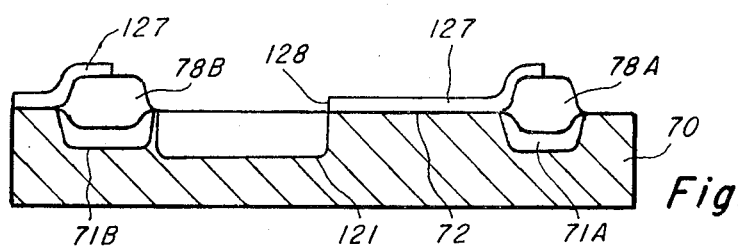
FIGS. 11a–11e are cross-sectional views taken through a second embodiment of one Hi-C cell of various steps in the construction process.
Figure 11B:
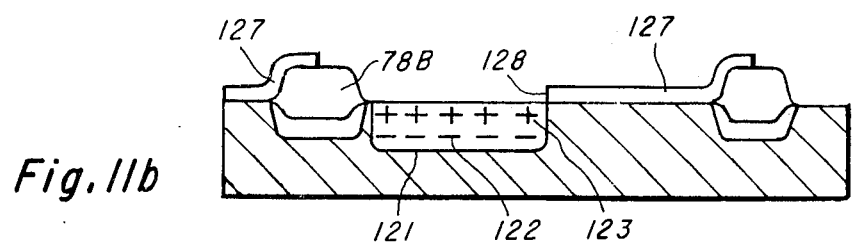

Referring now to FIGS. 11a–11e, a process for constructing a second embodiment of the Hi-C cell is illustrated. This embodiment is similar in many respects to the previously described cell. For example, as illustrated in FIG. 11b, this embodiment includes a storage region 121 which has a deep P-type ion layer 122 and a shallow N-type ion layer 123. Ion layers 122 and 123 have distribution peaks and dosages identical to those of the previously described deep ion layer 76 and shallow ion layer 75 respectively. This Hi-C cell also includes an overlying storage gate 124, and a transfer gate 125, which are separately operable from each other. However, the two Hi-C cell embodiments differ from each other, in that the second embodiment includes an additional N+ type region 126 similar to the N+ region 73. Region 126 is adjacent to storage region 121 and is spaced apart from source-bit line region 73. Also, transfer gate 125 does not overlie storage gate 124, but instead only overlies the surface region between regions 126 and 73.

The electrical operation of the second embodiment is very similar to the electrical operation of the first embodiment. Storage region 121 and region 126 act like storage region 74; and the surface area under gate 125 acts like transfer region 77. With these modifications, the surface potentials of the storage region and transfer region are the same for the two embodiments. In addition, both embodiments have the same high charge capacity per unit area, and both have reduced leakage current. This is because storage region 121 has the same construction as the previously described storage region 74.

FIG. 11a illustrates the initial steps for constructing this second embodiment of the invention. First, the cell area of each of the cells of array 11 are defined by forming channel stop regions 71a and 71b, and the corresponding field oxide regions 78a and 78b. Next, a photoresist layer 127 is selectively patterned on surface 72 of substrate 70 so as to expose storage region 121. Storage region 121 occupies the area lying between edge 128 of photoresist 127, and field oxide region 78b of each cell (just as did the previously described storage region 74).

Next, a P-type ion 122, and an N-type ion 123, are implanted into each storage region 121. Ion implant 122 is at the same depth, and has the same dosage, as the previously described deep ion implant 76. That is, the Gaussian distribution peak of ions 122 occurs within 1500Å–10,000Å from surface 72; and the dosage of ions 122 ranges between 1–40 × $10^{12}$ions/cm$^2$. Similarly, shallow ion layer 123 has a distribution peak and dosage identical to that of previously described shallow ion layer 75. The result of these implant steps is illustrated in FIG. 11b.

Figure 11C:
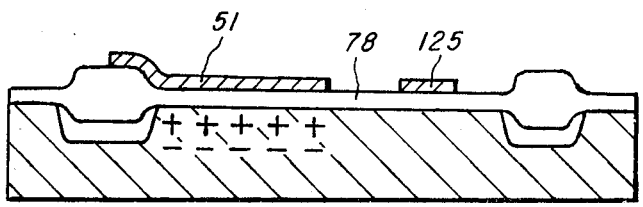

The next steps form storage gate regions 51 and transfer gate regions 125. First, photoresist layer 127 is removed. Then, insulating layer 78 is formed on top of surface 72. Next, a polysilicon layer is disposed on top of insulating layer 78. This polysilicon layer is then implanted to make it conductive, and then selectively masked and etched (using previously described steps) to form storage gate 51 and transfer gate 125. FIG. 11c illustrates the result of these steps.

Figure 11D:
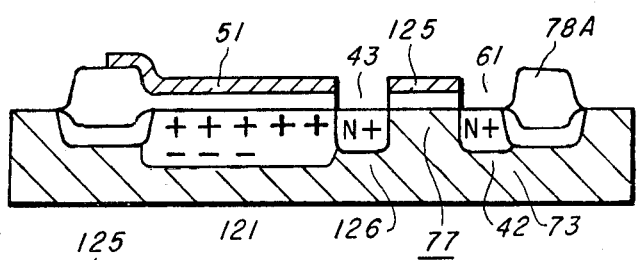

Next, the N+ type region 126 and the N+ region 73 are formed. This is accomplished by etching that portion of insulating layer 78 which lies between storage gate 51 and transfer gate 125; and also by etching that portion of insulating layer 78 lying between field oxide 78a and transfer gate 125. Then, an N-type implant or diffusion which is very high in dosage (approximately $10^{15}$–$10^{16}$ ions/cm$^2$) is made. And this high dosage completely eliminates any potential barriers near surface 72 at the interface between regions 121 and 126. This is because the ions implanted or diffused into region 126 laterally straggle or diffuse slightly into storage region 121. And therefore, ion layer 122 lies laterally within ion layer 123 at the interface between regions 121 and 126. The result of these steps is illustrated in FIG. 11d.

Figure 11E:
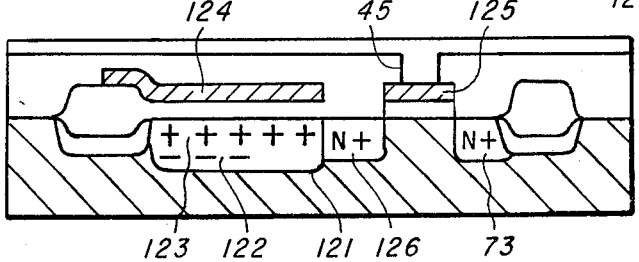

The remaining steps complete the construction of the cell. These steps include forming an insulating layer over the entire surface of the slice, etching this layer to form areas for word line contact 45, and patterning word lines on top of the insulating layer. The result of these steps is illustrated in FIG. 11e. Additional steps to coat the slice with a protective layer, to break the slice into individual chips, and to mount the chips into packages are subsequently performed in accordance with standard industry practice.

Various embodiments of the invention have now been described in detail. And from this description, it will be apparent that several modifications of these embodiments are possible. For example, the ions identified as N-type and P-type can all be reversed to P-type and N-type respectively. Additionally, semiconductor substrates other than silicon can be used. Therefore, since many changes and modifications can be made in the above details without departing from the nature and spirit of the invention, it is understood that the invention is not to be limited to said details except as set forth in the appended claims.

What is claimed is:

1. A method of constructing an array capacity memory cells comprising the steps of:
   (a) forming in a first surface of a semiconductor substrate, channel stop regions and overlying field insulator regions which are patterned to define a cell area for each cell of said array and several bit line areas which selectively interconnect said cell areas;
   (b) introducing ions having majority carriers of a first conductivity type throughout said cell areas, thereby forming a shallow ion layer throughout each cell area;
   (c) introducing ions having majority carriers of a second conductivity type throughout said cell areas at a level lying below said shallow ion layers, thereby forming a deep ion layer throughout each cell area;
   (d) disposing a first insulating layer on said first surface overlying said cell areas;
   (e) forming a patterned layer of conductive material on said insulating layer to define a storage gate region partially overlying each of said cell areas and spaced apart from said bit line areas;
   (f) removing from each of said cell areas, the portions of said shallow ion layer lying between said storage gate regions and said bit line areas, and
   (g) introducing ions having majority carriers of said first conductivity type, throughout the portion of each cell area lying between said storage gate regions and said bit line areas, at approximately the same depth and concentration as said deep ion layer lying therein.

2. A method according to claim 1 wherein said ions of step (g) are introduced by an ion implant operation after said storage gate regions are formed and at an energy sufficient to produce lateral struggle under said storage gate regions.

3. A method according to claim 1 wherein step (c) is performed by an ion implantation at an energy level sufficient to produce straggle from said cell areas into said channel stop regions.

4. A method according to claim 1 wherein said shallow ion layer of each cell area is formed by implanting ions directly into said substrate before said first insulating layer is disposed thereon.

5. A method according to claim 1 wherein said first insulating layer is disposed on said first surface, and subsequently said shallow ion layer of each cell area is formed by implanting ions of said first conductivity type through said first insulating layer.

6. A method according to claim 1 wherein said first insulating layer is disposed on said first surface, and subsequently said shallow ion layer of each cell area is formed by (h) implanting ions of said first conductivity type into said first insulating layer and (i) exposing said substrate to a high temperature atmosphere thereby diffusing said first conductivity type ions from said insulating layer into said underlying substrate.

7. A method according to claim 1 wherein said shallow ion layer of each cell area is introduced so as to have a Gaussian distribution peak within 500Å from said first surface, and wherein said deep ion layer of each cell area is introduced so as to have a Gaussian distribution peak within 1500Å–10,000Å from said first surface.

8. A method according to claim 1 wherein said ions comprising said shallow ion layer of each cell area and said deep ion layer of each cell area are introduced into said substrate at concentrations of approximately 1–40 × $10^{12}$ions/cm$^2$.

9. A method according to claim 1 wherein said ions of said first conductivity type are selected from the group consisting of arsenic, antimony and phosphorus ions, and wherein said ions of said second conductivity type are boron ions.

10. A method according to claim 1 wherein said field insulator regions are at least partially exposed, while said steps (b) and (c) are performed.

11. A method according to claim 1 wherein step (e) is performed by disposing an unpatterned layer of conductive material on said insulating layer and selectively removing portions thereof.

12. A method of constructing an array of high capacity memory cells comprising the steps of:
   (a) forming in a first surface of a semiconductor substrate, channel stop regions and overlying field insulator regions which are patterned to define a cell area for each cell of said array and several bit line areas which selectively interconnect said cell areas;

(b) disposing a first insulating layer on said first surface overlying said cell areas;

(c) forming a patterned layer of conductive material on said first insulating layer to define transfer gate regions overlying a portion of each of said cell areas lying adjacent to said bit line areas;

(d) introducing ions having majority carriers of a first conductivity type, throughout the portion of said cell areas not covered by said transfer gate regions, thereby forming a shallow ion layer in each of said cell areas;

(e) exposing said substrate to a high temperature atmosphere to diffuse said shallow ion layer laterally and partially under said transfer gate regions and subsequently;

(f) introducing ions having majority carriers of a second conductivity type throughout said portions of said cell areas not covered by said transfer gate regions, at a level lying below said shallow ion layers, thereby forming in each cell area deep ion layer lying laterally within said shallow ion layer of that cell area.

13. A method according to claim 12 wherein said step (f) is performed by an ion implantation at an energy level sufficient to produce straggle from said cell areas into said channel stop regions.

14. A method according to claim 12 wherein said shallow ion layer of each cell area is introduced by implanting ions directly into said substrate after said transfer gate regions are formed.

15. A method according to claim 12 wherein said shallow ion layer of each cell area is introduced by implanting ions of said first type through said first insulating layer after said transfer gate regions are formed.

16. A method according to claim 12 wherein said transfer gate regions are formed and subsequently said shallow ion layer of each cell is introduced by (g) implanting ions of said first conductivity type into said first insulating layer and (h) exposing said substrate to a high temperature atmosphere thereby diffusing said first conductivity type ions from said insulating layer into said underlying substrate.

17. A method according to claim 12 wherein said shallow ion layer of each cell area is introduced so as to have a Gaussian distribution peak within 500Å from said first surface, and wherein said deep ion layer of each cell area is introduced so as to have a Gaussian distribution peak within 1500Å–10,000Å from said first surface.

18. A method according to claim 12 wherein said ions comprising said shallow ion layer and said deep ion layer of each cell area are introduced into said substrate at concentrations of approximately $1-40 \times 10^{12}$ ions/cm$^2$.

19. A method according to claim 12 wherein said ions of said first conductivity type are selected from the group consisting of arsenic, antimony and phosphorus ions, and wherein said ions of said second conductivity type are boron ions.

20. A method according to claim 12 wherein said transfer gate regions and portions of said field insulator regions are exposed while said steps (d) and (f) are performed.

21. A method according to claim 12 wherein step (e) is performed by disposing an unpatterned layer of conductive material on said insulating layer and selectively removing portions thereof.

22. A method according to claim 12 including the step of introducing ions, of said first conductivity type, into said bit line areas up to said transfer gate regions, at a dosage which at least cancels said deep ion layers lying therein.

23. A method of constructing an array of high capacity memory cell comprising the steps of:

(a) forming in a first surface of a semiconductor substrate, channel stop regions and overlying field insulator regions which are patterned to define a cell area of each cell of said array and several bit line areas which selectively interconnect said cell areas;

(b) introducing ions having majority carriers of a first conductivity type, throughout said cell areas, thereby forming a shallow ion layer throughout each of said cell areas;

(c) disposing a first insulating layer on said first surface overlying said cell areas;

(d) masking each of said cell areas so as to expose a storage region lying within each of said cell areas and spaced apart from said bit line areas;

(e) introducing ions having majority carries of a second conductivity type, into each of said storage regions at a level lying below said shallow ion layers to form a deep ion layer in each of said cell areas;

(f) forming a patterned layer of conductive material on said first insulating layer to define a storage gate region overlying each of said storage regions;

(g) removing the portion of said shallow ion layers lying between said storage gate regions and said bit line areas.

24. A method according to claim 23 wherein said step (e) is performed by an ion implantation at an energy level sufficient to produce straggle from said storage regions into the portions of said channel stop regions which lie adjacent said storage regions.

25. A method according to claim 23 wherein said shallow ion layer of each cell area is formed by implanting ions directly into said substrate before said first insulating layer is disposed thereon.

26. A method according to claim 23 wherein said first insulating layer is disposed on said first surface, and subsequently said shallow ion layer of each cell area is formed by implanting ions of said first conductivity type through said first insulating layer.

27. A method according to claim 23 wherein said shallow ion layer of each cell area is formed by (h) implanting ions of said first conductivity type throughout said first insulating layer; (i) removing the portions of said first insulating layer lying between said storage gate regions and channel stop regions; and (j) exposing said substrate to a high temperature atmosphere to diffuse said first conductivity type ions from the remaining portions of said first insulating layer into said underlying substrate.

28. A method according to claim 23 wherein said shallow ion layer of each cell area is introduced so as to have a Gaussian distribution peak within 500Å from said first surface, and wherein said deep ion layer of each cell area is introduced so as to have a Gaussian distribution peak within 1500–10,000Å from said first surface.

29. A method according to claim 23 wherein said ions comprising said shallow ion layer of each cell area and said deep ion layer of each cell area are introduced into said substrate at concentrations of approximately 1–40 $\times$ $10^{12}$ions/cm$^2$.

30. A method according to claim 23 wherein said first ions of said first conductivity type are selected from the group consisting of arsenic, antimony and phosphorus ions, and wherein said ions of said second conductivity type are boron ions.

31. A method according to claim 23 wherein said step (e) is performed such that said deep ion layer lies laterally within said storage region.

32. A method according to claim 23 wherein step (f) is performed by disposing an unpatterned layer of conductive material on said insulating layer and selectively removing portions thereof.

33. A method of constructing an array of high capacity memory cells comprising the steps of:
   (a) forming in a first surface of a semiconductor substrate, channel stop regions and overlying field insulator regions which are patterned to define a cell area for each cell of said array and several bit line areas which selectively interconnect said cell areas;
   (b) masking each of said cell areas so as to expose a storage region lying therein and spaced apart from said bit line areas;
   (c) introducing ions, having majority carriers of a first conductivity type, throughout each of said storage regions thereby forming a shallow ion layer in each cell area;
   (d) masking each of said cell areas so as to expose said storage regions except in the area lying closest to said spaced apart bit line areas;
   (e) introducing ions having majority carriers of a second conductivity type, throughout said partially exposed storage regions, and at a level lying below said shallow ion layer lying therein to form a deep ion in each of said cell areas;
   (f) disposing a first insulating layer on said first surface overlying said cell areas; and
   (g) forming a patterned layer of conductive material on said first insulating layer to define a storage gate region overlying said storage region of each of said cell areas.
   (h) selectively removing portions of said conductive material to form a storage gate region overlying said storage region of each of said cell areas.

34. A method according to claim 33 wherein said masking of said step (d) is performed by heat softening the mask employed in said step (b).

35. A method according to claim 33 wherein said step (e) is performed by an ion implantation at an energy level sufficient to produce straggle from said storage regions into said channel stop regions lying adjacent thereto.

36. A method according to claim 33 wherein said hollow ion layer of each cell area is formed by implanting ions directly into said substrate before said first insulating layer is disposed thereon.

37. A method according to claim 33 wherein said first insulting layer is disposed on said first surface, and subsequently said shallow ion layer of each cell area is formed by implanting ions of said first conductivity type through said first insulating layer.

38. A method according to claim 33 wherein said shallow ion layer is formed by (h) implanting ions of said first conductivity type into said first insulating layer and (i) exposing said substrate to a high temperature atmosphere to diffuse said first conductivity type ions from said insulating layer into said underlying substrate.

39. A method according to claim 33 wherein said shallow ion layer of each cell area is introduced so as to have a Gaussian distribution peak within 500Å from said first surface, and wherein said deep ion layer of each cell area is introduced so as to have a Gaussian distribution peak within 1500–10,000Å from said first surface.

40. A method according to claim 33 wherein said ions comprising said shallow ion layer and said deep ion layer of each cell area are introduced into said substrate at concentrations of approximately 1–40 $\times$ $10^{12}$ions/cm$^2$.

41. A method according to claim 33 wherein said ions of said first conductivity type are selected from the group consisting of arsenic, antimony and phosphorus ions, and wherein said ions of said second conductivity type are boron ions.

42. A method according to claim 33 wherein step (g) is performed by disposing an unpatterned layer of conductive material on said insulating layer and selectively removing portions thereof.

43. A method of constructing an array of high capacity memory cells comprising the steps of:
   (a) forming in a first surface of a semiconductor substrate, channel stop regions and overlying field insulator regions which are patterned to efine a cell area for each cell of said array and several bit lines areas which selectively interconnect said cell areas;
   (b) masking each of said cell areas so as to expose a storage region lying therein and spaced apart from said bit line areas;
   (c) introducing ions having majority carriers of a first conductivity type, throughout each of said storage regions, thereby forming a shallow ion layer lying therein;
   (d) introducing ions having majority carriers of a second conductivity type, throughout said storage regions at a level below said shallow ion layer lying therein, thereby forming a deep ion layer in each cell area;
   (e) disposing a first insulating layer, on said first surface, overlying said cell areas;
   (f) forming a patterned layer of conductive material on said first insulating layer to define a storage gate region for each of said cell areas lying above said storage regions, and to further define a transfer gate region for each of said cell areas lying between and spaced apart from said storage gate regions and said bit line areas;
   (g) introducing ions of said first conductivity type into the portion of each of said cell areas lying between said storage gate region and said transfer gate region.

44. A method according to claim 43 wherein said step (d) is performed by an ion implantation at an energy level sufficient to produce straggle from said storage regions into said channel stop regions.

45. A method according to claim 43 wherein said step (g) introduces ions of said first conductivity type at a level and dosage which at least cancel any of said second conductivity type ions lying therein.

46. A method according to claim 43 wherein said shallow ion layer is formed by implanting ions directly into said substrate before said first insulating layer is disposed thereon.

47. A method according to claim 43 wherein said first insulating layer is disposed on said first surface, and subsequently said shallow ion layer of each cell area is formed by implanting ions of said first conductivity type through said first insulating layer.

48. A method according to claim 43 wherein said shallow ion layer of each cell area if formed by (h) implanting ions of said first conductivity type into said first insulating layer and (i) exposing said substrate to a high temperature atmosphere thereby diffusing said first conductivity type ions from said insulating layer into said underlying substrate.

49. A method according to claim 43 wherein said shallow ion layer of each cell area is introduced so as to have a Gaussian distribution peak within 500Å from said first surface, and wherein said deep ion layer of each cell area is introduced so as to have a Gaussian distribution peak within 1500–10,000Å from said first surface.

50. A method according to claim 43 wherein said ions comprising said shallow ion layer and said deep ion layer of each cell area are introduced into said substrate at concentrations of approximately $1-40 \times 10^{12}$ ions/cm$^2$.

51. A method according to claim 43 wherein ions of said first conductivity type are selected from the group consisting of arsenic, antimony and phosphorus ions, and wherein said ions of said second conductivity type are boron ions.

* * * * *